United States Patent
Hu et al.

(10) Patent No.: US 12,205,949 B1
(45) Date of Patent: Jan. 21, 2025

(54) HIGH-VOLTAGE SEMICONDUCTOR DEVICE STRUCTURES

(71) Applicant: GlobalFoundries U.S. Inc., Malta, NY (US)

(72) Inventors: Zhenyu Hu, Clifton Park, NY (US); Hong Yu, Clifton Park, NY (US); Haiting Wang, Clifton Park, NY (US)

(73) Assignee: GlobalFoundries U.S. Inc., Malta, NY (US)

(*) Notice: Subject to any disclaimer, the term of this patent is extended or adjusted under 35 U.S.C. 154(b) by 0 days.

(21) Appl. No.: 18/758,069

(22) Filed: Jun. 28, 2024

(51) Int. Cl.
| | |
|---|---|
| *H01L 27/088* | (2006.01) |
| *H01L 27/06* | (2006.01) |
| *H01L 29/40* | (2006.01) |
| *H01L 29/51* | (2006.01) |
| *H01L 29/66* | (2006.01) |
| *H01L 29/78* | (2006.01) |

(52) U.S. Cl.
CPC ...... *H01L 27/0886* (2013.01); *H01L 27/0629* (2013.01); *H01L 29/401* (2013.01); *H01L 29/513* (2013.01); *H01L 29/518* (2013.01); *H01L 29/78* (2013.01); *H01L 29/785* (2013.01); *H01L 29/66568* (2013.01); *H01L 29/66795* (2013.01)

(58) Field of Classification Search
CPC ............. H01L 27/0886; H01L 27/0629; H01L 29/401; H01L 29/513; H01L 29/518; H01L 29/78; H01L 29/785; H01L 29/66568; H01L 29/66795
See application file for complete search history.

(56) References Cited

U.S. PATENT DOCUMENTS

| | | | |
|---|---|---|---|
| 8,043,923 B2* | 10/2011 | Kim .................... | H01L 29/6659 438/303 |
| 8,159,040 B2 | 4/2012 | Coolbaugh et al. | |
| 10,050,033 B1 | 8/2018 | Thei et al. | |
| 11,417,739 B2 | 8/2022 | Lin et al. | |
| 2009/0174001 A1* | 7/2009 | Lee ..................... | H01L 29/7851 257/E27.06 |
| 2014/0209994 A1* | 7/2014 | Roizin .............. | H01L 29/66833 257/324 |
| 2022/0270973 A1* | 8/2022 | Verma .................. | H01L 23/552 |
| 2023/0081072 A1* | 3/2023 | Ramkumar .......... | H01L 29/792 438/258 |
| 2024/0021614 A1 | 1/2024 | Chuang et al. | |

* cited by examiner

*Primary Examiner* — Peniel M Gumedzoe
(74) *Attorney, Agent, or Firm* — Thompson Hine LLP; Francois Pagette

(57) ABSTRACT

Device structures for a high-voltage semiconductor device and methods of forming such device structures. The structure comprises a semiconductor substrate and a layer stack including a first dielectric layer and a second dielectric layer. The first dielectric layer is positioned between the second dielectric layer and the semiconductor substrate. The structure further comprises a field-effect transistor including a first source/drain region in the semiconductor substrate, a second source/drain region in the semiconductor substrate, and a metal gate on the layer stack laterally between the first source/drain region and the second source/drain region. The second dielectric layer is positioned between the metal gate and the first dielectric layer. A contact extends through the layer stack to the first source/drain region.

20 Claims, 4 Drawing Sheets

HIGH-VOLTAGE SEMICONDUCTOR DEVICE STRUCTURES

BACKGROUND

The disclosure relates to semiconductor device fabrication and integrated circuits and, more specifically, to device structures for a high-voltage semiconductor device and methods of forming such device structures.

Complementary-metal-oxide-semiconductor processes may be used to build a combination of p-type and n-type field-effect transistors that are used to construct, for example, logic cells. Field-effect transistors generally include a semiconductor body supplying a channel region in a substrate, a source, a drain, and a gate structure over the semiconductor body. When a control voltage exceeding a characteristic threshold voltage is applied to a gate electrode of the gate structure, carrier flow occurs in the channel region between the source and drain to produce a device output current.

A fin-type field-effect transistor is a non-planar device structure that may be more densely packed in an integrated circuit than a planar field-effect transistor. A fin-type field-effect transistor may include a fin providing a semiconductor body, a gate structure that overlaps with a portion of the fin, and heavily-doped source/drain regions arranged on opposite sides of the gate structure. The source/drain regions may be epitaxially grown in cavities that are etched in the fin.

Planar field-effect transistors may be configured to operate at a high voltage, such as a voltage within a range of 20 volts to 25 volts. High-voltage planar field-effect transistors cannot be integrated into a process flow forming fin-type field-effect transistors without impacting the formation of the fin-type field-effect transistors.

Improved device structures for a high-voltage semiconductor device and methods of forming such device structures are needed.

SUMMARY

In an embodiment of the invention, a structure comprises a semiconductor substrate and a layer stack including a first dielectric layer and a second dielectric layer. The first dielectric layer is positioned between the second dielectric layer and the semiconductor substrate. The structure further comprises a field-effect transistor including a first source/drain region in the semiconductor substrate, a second source/drain region in the semiconductor substrate, and a metal gate on the layer stack laterally between the first source/drain region and the second source/drain region. The second dielectric layer is positioned between the metal gate and the first dielectric layer. A contact extends through the layer stack to the first source/drain region.

In an embodiment of the invention, a method comprises forming a layer stack including a first dielectric layer and a second dielectric layer. The first dielectric layer is positioned between the second dielectric layer and a semiconductor substrate. The method further comprises forming a field-effect transistor including a first source/drain region in the semiconductor substrate, a second source/drain region in the semiconductor substrate, and a metal gate on the layer stack laterally between the first source/drain region and the second source/drain region. The second dielectric layer is positioned between the metal gate and the first dielectric layer. The method further comprises forming a contact that extends through the layer stack to the first source/drain region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
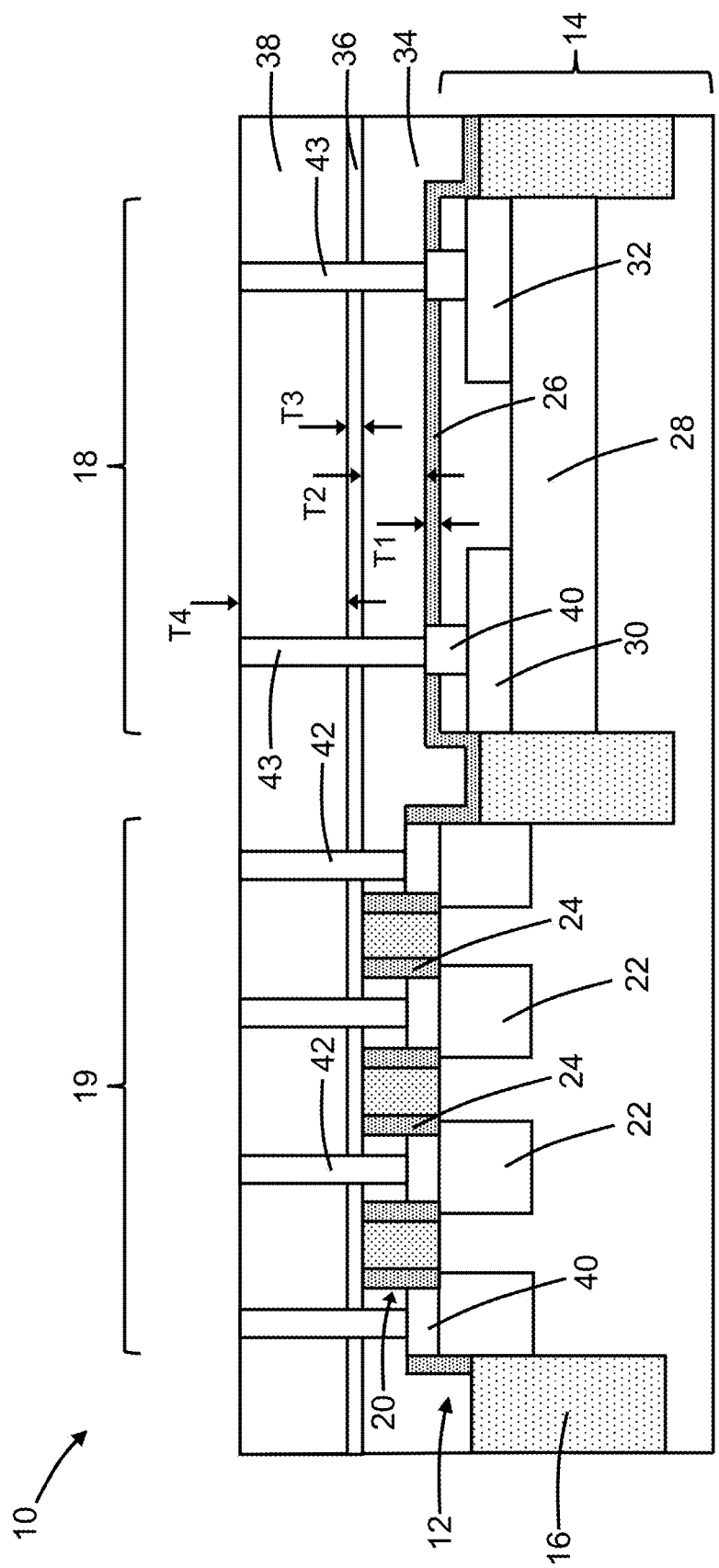
FIG. 1 is a cross-sectional view of a structure at an initial fabrication stage of a processing method in accordance with embodiments of the invention.

With reference to FIG. 1 and in accordance with embodiments of the invention, a structure 10 includes a fin 12 and a semiconductor substrate 14. The fin 12 and the semiconductor substrate 14 may be comprised of a single-crystal semiconductor material, such as single-crystal silicon. The semiconductor material of the semiconductor substrate 14 may be lightly doped with a concentration of a p-type dopant (e.g., boron). The fin 12 may be patterned from the semiconductor material of the semiconductor substrate 14 using lithography and etching processes. The fin 12 may be arranged in a device region 19 of the semiconductor substrate 14.

Shallow trench isolation regions 16 may be formed by patterning shallow trenches in the semiconductor substrate 14 with lithography and etching processes, depositing a dielectric material, such as silicon dioxide, in the shallow trenches, and planarizing and/or recessing the deposited dielectric material. The shallow trench isolation regions 16 fully surround a planar device region 18 in which a high-voltage semiconductor device structure in the representative form of a field-effect transistor may be formed. The planar device region 18 lacks a fin similar to the fin 12, and the field-effect transistor formed in the planar device region 18 that does not integrate a fin.

The fin 12 in the device region 19 is used to fabricate a fin-type field-effect transistor that includes gate structures 20 that extend transversely across the fin 12 and source/drain regions 22 disposed laterally between the gate structures 20. The gate structures 20 may include an upper layer comprised of one or more metals, such as a work function metal and tungsten, and a lower layer comprised of an electrical insulator, such as a high-k dielectric material like hafnium dioxide. The gate structures 20 may be formed by, for example, a replacement-metal-gate process.

The source/drain regions 22 may include semiconductor layers inside cavities that are patterned in the fin 12 by lithography and etching processes. As used herein, the term "source/drain region" means a region of semiconductor material that can function as either a source or a drain of a field-effect transistor. The source/drain regions 22 may be comprised of a semiconductor material, such as silicon or silicon-germanium. The semiconductor material of the source/drain regions 22 may be grown by an epitaxial growth process from the surfaces of the fin 12 bordering the cavities. The semiconductor material of the source/drain regions 22 may be in situ doped during epitaxial growth with a concentration of a dopant. The semiconductor material of the source/drain regions 22 may be doped with an n-type dopant (e.g., phosphorus and/or arsenic) that provides n-type conductivity. Alternatively, the semiconductor material of the source/drain regions 22 may be doped with a p-type dopant (e.g., boron) that provides p-type conductivity.

Sidewall spacers 24 are formed that respectively surround a sidewall of each gate structure 20 in the device region 19. The sidewall spacers 24 may be formed by depositing a conformal dielectric layer 26 comprised of a dielectric material over the device region 19 and also over the planar device region 18, and then etching the deposited conformal layer with an anisotropic etching process, such as reactive ion etching. The sidewall spacers 24 may be comprised of a dielectric material, such as silicon nitride. The dielectric layer 26 in the planar device region 18 may be covered by an etch mask during the formation of the sidewall spacers 24 and may therefore not be removed by the anisotropic etching process forming the sidewall spacers 24. In an embodiment, the dielectric layer 26 in the planar device region 18 may have a thickness T1 of about 10 nanometers to about 15 nanometers.

A well 28 may be formed in a portion of the planar device region 18 of the semiconductor substrate 14. In an embodiment, the well 28 may contain a concentration of a p-type dopant (e.g., boron) to provide p-type conductivity. The well 28 may be formed by implanting ions, such as ions including the p-type dopant, with an implantation mask having an opening defining the intended location for the well 28 in the semiconductor substrate 14. The implantation conditions, such as ion species, dose, and kinetic energy, may be selected to tune the electrical and physical characteristics of the well 28. The well 28 may provide a drain extension of the field-effect transistor formed in the planar device region 18.

Doped regions 30, 32 are formed in respective portions of the planar device region 18 of the semiconductor substrate 14. The doped regions 30, 32 are positioned between a top surface of the semiconductor substrate 14 in the planar device region 18 and the well 28. The doped regions 30, 32 have an opposite conductivity type from the well 28. In an embodiment, the doped regions 30, 32 may contain a concentration of an n-type dopant (e.g., arsenic or phosphorus) to provide n-type conductivity. The doped regions 30, 32 may be formed by implanting ions, such as ions including the n-type dopant, with an implantation mask having openings defining the intended locations for the doped regions 30, 32 in the semiconductor substrate 14. The implantation conditions, such as ion species, dose, and kinetic energy, may be selected to tune the electrical and physical characteristics of the doped regions 30, 32, which may be heavily doped. The doped region 30 provides a source/drain region of the field-effect transistor formed in the planar device region 18, and the doped region 32 provides another source/drain region of the field-effect transistor formed in the planar device region 18.

A dielectric layer 34 is formed as a blanket layer that overlaps with both device regions 18, 19. More specifically, the dielectric layer 34 overlaps with the fin 12 and the gate structures 20 of the fin-type field-effect transistor in the device region 19, and the dielectric layer 34 also overlaps with the semiconductor substrate 14 in the planar device region 18. In an embodiment, the dielectric layer 34 may be comprised of a dielectric material, such as silicon dioxide, that is deposited and planarized by chemical-mechanical polishing to remove topography. In an embodiment, the dielectric layer 34 may have a thickness T2 in the planar device region 18 of about 20 nanometers to about 25 nanometers.

Dielectric layer 36, 38 are formed over the dielectric layer 34. The dielectric layers 36, 38 also overlap with both device regions 18, 19. The dielectric layers 36, 38 are separated from the fin 12 and the gate structures 20 of the fin-type field-effect transistor in the device region 19 by the dielectric layer 34. For that reason, both of the dielectric layers 36, 38 have a non-contacting relationship with the gate structures 20. In an embodiment, the dielectric layer 36 may be comprised of a dielectric material, such as silicon nitride. In an embodiment, the dielectric layer 38 may be comprised of a dielectric material, such as silicon dioxide. In an embodiment, the dielectric layer 36 may have a thickness T3 of about 5 nanometers to about 10 nanometers. In an embodiment, the dielectric layer 36 may have a thickness T4 of about 40 nanometers to about 50 nanometers.

Trench silicide contacts 40 may be formed that physically and electrically contact the source/drain regions 22 of the fin-type field-effect transistor in the device region 19 and the source/drain regions represented by the doped regions 30, 32 of the field-effect transistor formed in the planar device region 18. The trench silicide contacts 40 may contain a metal silicide, such as titanium silicide, formed by a silicidation process. Contacts 42 are formed that are physically and electrically coupled by the trench silicide contacts 40 to the source/drain regions 22 of the fin-type field-effect transistor in the device region 19. Contacts 43 are formed that are physically and electrically coupled by the trench silicide contacts 40 to the source/drain regions represented by the doped regions 30, 32 of the field-effect transistor formed in the planar device region 18. The contacts 42, 43 may be comprised of, for example, tungsten that is deposited in patterned contact openings extending through the dielectric layers 34, 36, 38 and planarized by chemical-mechanical polishing.

Figure 2:
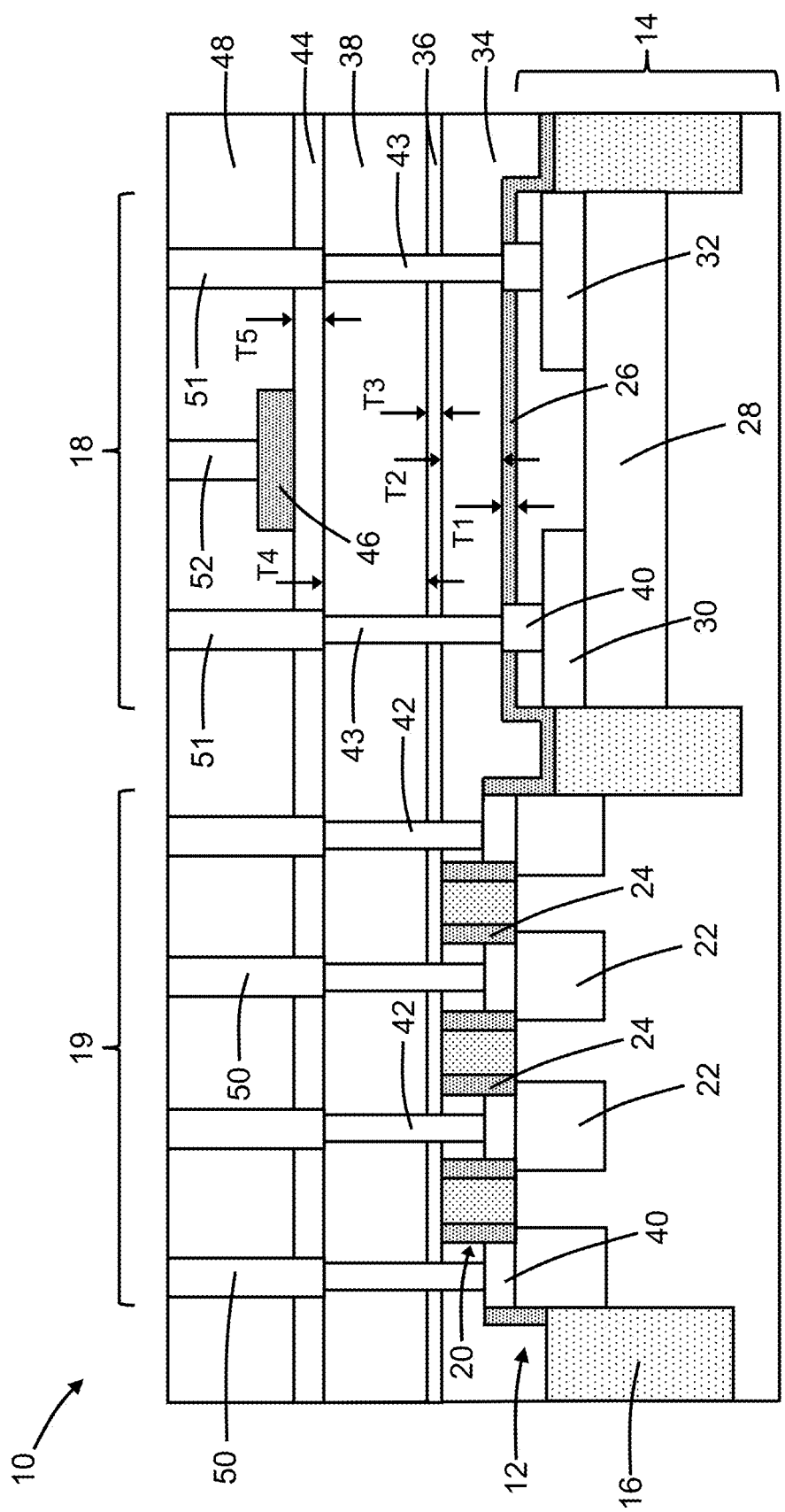
FIG. 2 is a cross-sectional view of the structure at a fabrication stage of the processing method subsequent to FIG. 1.

With reference to FIG. 2 in which like reference numerals refer to like features in FIG. 1 and at a subsequent fabrication stage of the processing method, a dielectric layer 44 is formed that overlaps with the dielectric layer 38. In an embodiment, the dielectric layer 44 may be comprised of a dielectric material that contains carbon, such as carbon-doped silicon nitride deposited by, for example, chemical vapor deposition or plasma-enhanced chemical vapor deposition. In an embodiment, the dielectric layer 44 may have a thickness T5 of about 15 nanometers to about 20 nanometers.

A conductor layer 46 may be formed in the planar device region 18 on the layer stack that includes the dielectric layers 37, 34, 36, 38, 44. The conductor layer 46 may be comprised of a metal, such as tungsten silicide, that is deposited and patterned by lithography and etching processes. The patterned conductor layer 46 provides a gate electrode of the field-effect transistor formed in the planar device region 18. The gate electrode represented by the patterned conductor layer 46 is laterally disposed, in a different plane, between the source/drain regions represented by the doped region 30 and the doped region 32. The portions of the dielectric layer 26, the dielectric layer 34, the dielectric layer 36, the dielectric layer 38, and the dielectric layer 44 between the conductor layer 46 and the underlying semiconductor substrate 14 collectively provide a multiple-layer gate dielectric layer of the field-effect transistor including a gate represented by the conductor layer 46. The thickness of the gate dielectric layer is provided by the sum of the thicknesses of the dielectric layer 26, the dielectric layer 34, the dielectric layer 36, the dielectric layer 38, and the dielectric layer 44. The multiple-layer gate dielectric layer is vertically positioned between the gate electrode represented by the conductor layer 46 and the semiconductor substrate 14 in the planar device region 18.

A dielectric layer 48 is formed as a blanket layer over the dielectric layer 44 and the conductor layer 46. In an embodiment, the dielectric layer 48 may be comprised of a dielectric material, such as silicon dioxide. Contacts 50 are formed that are respectively physically and electrically coupled to the contacts 42. Contacts 51, 52 are formed that are respectively physically and electrically coupled to the contacts 43 and to the patterned conductor layer 46. The contacts 50, 51, 52 may be comprised of, for example, tungsten that is deposited in contact openings in the dielectric layer 48 and planarized by chemical-mechanical polishing.

The field-effect transistor formed in the planar device region 18 is a different type of transistor from the fin-type field-effect transistor that is formed in the device region 19 using the fin 12. In that regard, the field-effect transistor formed in the planar device region 18 may be a high-voltage semiconductor device structure capable of handling higher voltages, such as voltages on the order of 20 volts to 25 volts, than the fin-type field-effect transistor formed in the device region 19 using the fin 12. The high voltage handling capability is enabled because the multiple dielectric layers 26, 34, 36, 38, 44 that are included as sublayers in the multiple-layer gate dielectric layer provide a thick gate dielectric layer for the gate electrode represented by the patterned conductor layer 46. The high-voltage field-effect transistor is formed in the planar device region 18 by an innovative approach that provides a thick gate dielectric layer without impacting the process flow forming the fin-type field-effect transistor in the device region 19.

Figure 3:
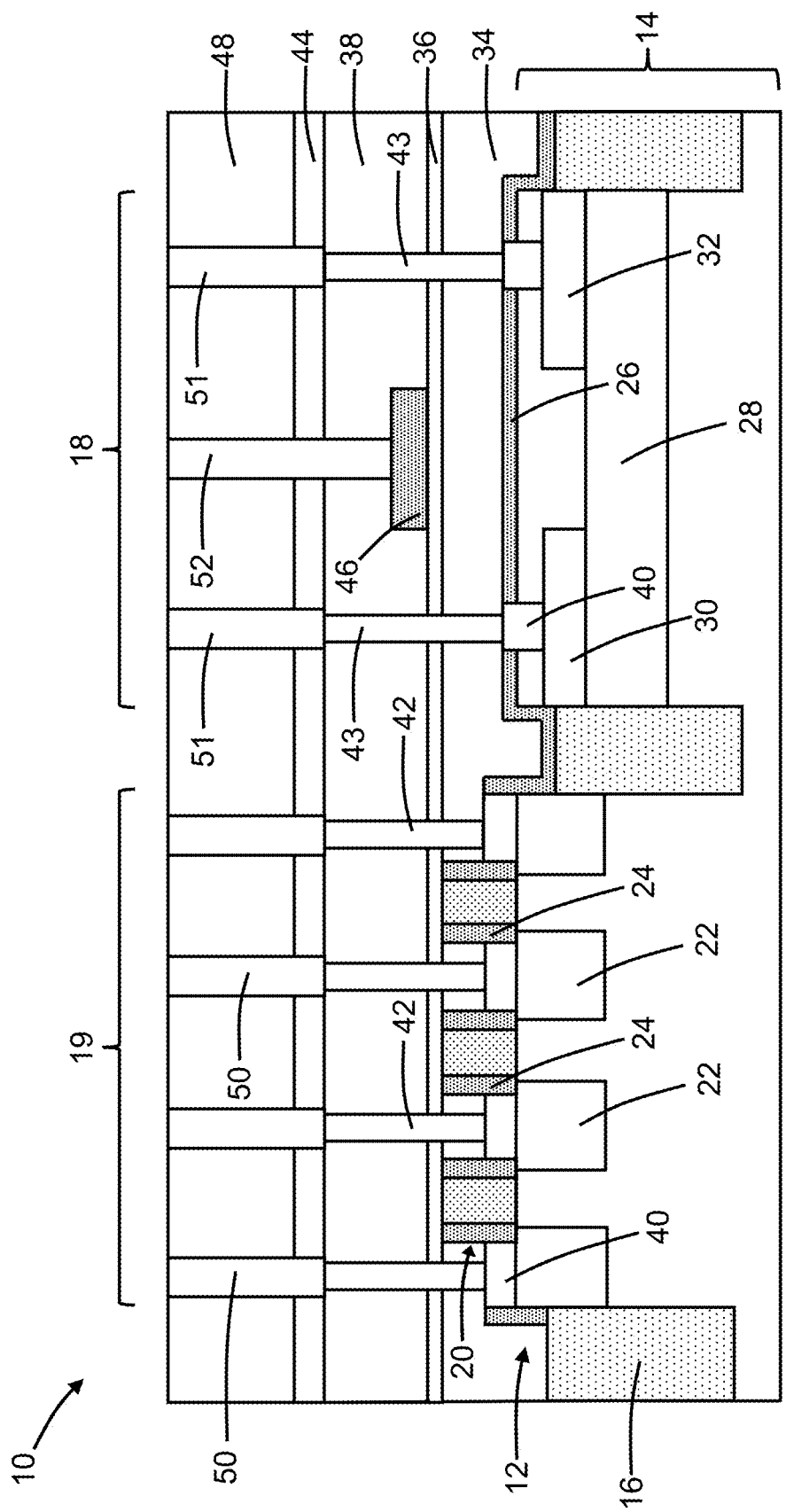
FIG. 3 is a cross-sectional view of a structure in accordance with alternative embodiments of the invention.

With reference to FIG. 3 and in accordance with alternative embodiments, the patterned conductor layer 46 representing the gate electrode of the field-effect transistor in the structure 10 may be formed on the dielectric layer 36 instead of being formed on the dielectric layer 44. The dielectric layer 26, the dielectric layer 34, and the dielectric layer 36 provide sublayers of the multiple-layer gate dielectric layer for the field-effect transistor embodied in the structure 10. Consequently, the thickness of the gate dielectric layer for the field-effect transistor is provided by the sum of the thicknesses of the dielectric layer 26, the dielectric layer 34, and the dielectric layer 36 in the planar device region 18.

The field-effect transistor including the patterned conductor layer 46 is formed in the planar device region 18 of the semiconductor substrate 14 and the fin-type field-effect transistor including the fin 12 is formed in the device region 19 of the semiconductor substrate 14. The patterned conductor layer 46 of the structure for the field-effect transistor in FIG. 3 is characterized by a thinner gate dielectric layer than the gate dielectric layer of the structure 10 for the field-effect transistor of FIG. 2. Nonetheless, the field-effect transistor in the planar device region 18 that includes the patterned conductor layer 46 may be capable of handling higher voltages than the field-effect transistor formed in the device region 19 using the fin 12.

In an embodiment, the structure 10 for the field-effect transistor including the patterned conductor layer 46 on the dielectric layer 36 may be formed in the planar device region 18 of the semiconductor substrate 14, and the structure 10 for the field-effect transistor including the patterned conductor layer 46 on the dielectric layer 44, which is a different transistor type with a different voltage-handling ability, may be formed in a different planar device region of the semiconductor substrate 14. As a result, field-effect transistors of different voltage-handling capability may be integrated on the same semiconductor substrate 14 with the fin-type field-effect transistor.

Figure 4:
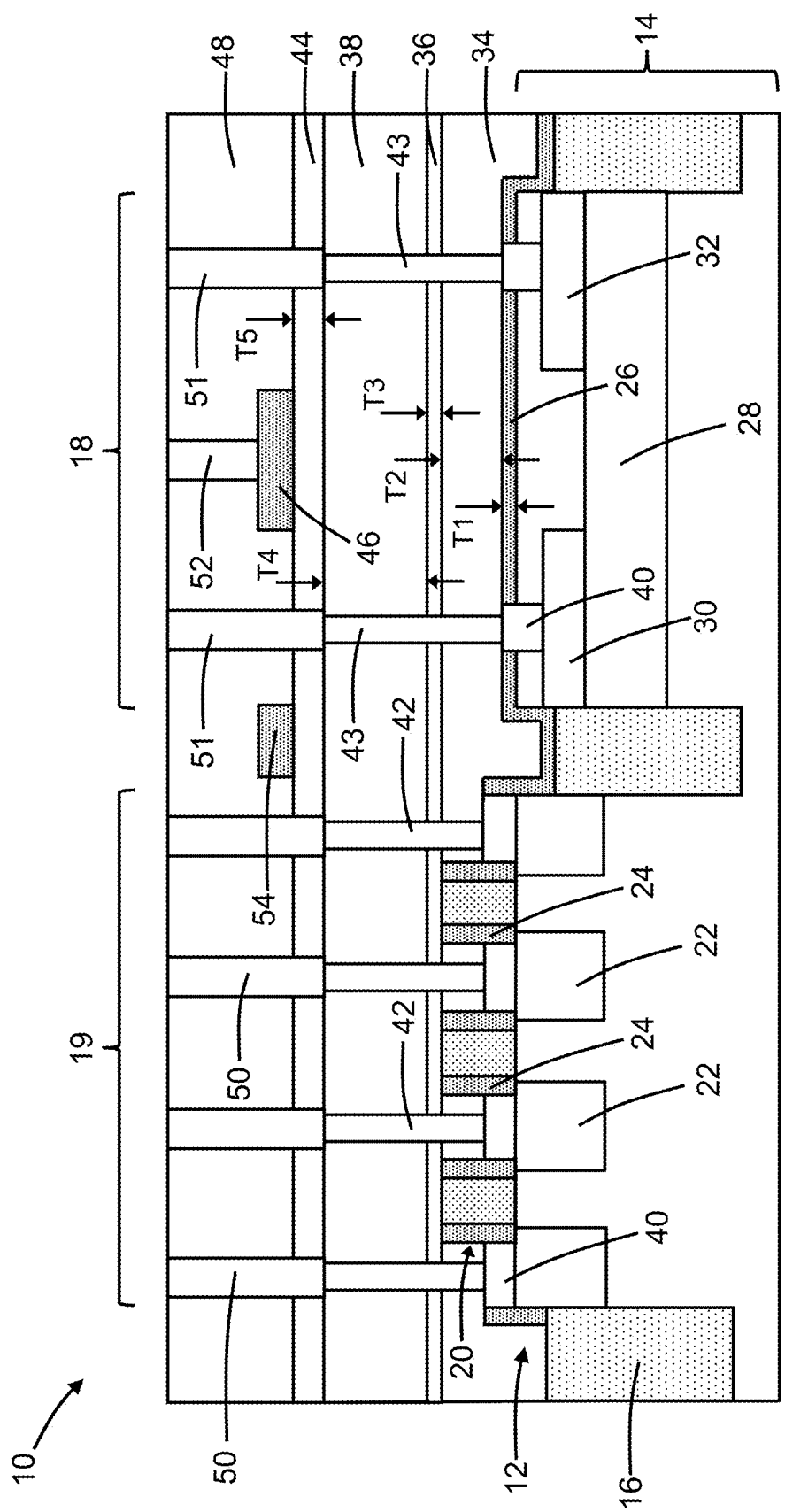
FIG. 4 is a cross-sectional view of a structure in accordance with alternative embodiments of the invention.

With reference to FIG. 4 and in accordance with alternative embodiments, the structure 10 may further include a resistor 54 as a passive device structure. In an embodiment, the resistor 54 may be formed from the same deposited layer of metal as the conductor layer 46 representing the gate electrode of the field-effect transistor formed in the planar device region 18. In that regard, the resistor 54 may be comprised of the same metal, such as tungsten silicide, as the patterned conductor layer 46. In an embodiment the resistor 54 may also be formed on the dielectric layer 44. The opposite ends of the resistor 54 may be coupled with contacts or vias (not shown) to enable its operation.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor substrate;
a layer stack including a first dielectric layer and a second dielectric layer, the first dielectric layer between the second dielectric layer and the semiconductor substrate;
a first field-effect transistor including a first source/drain region in the semiconductor substrate, a second source/drain region in the semiconductor substrate, and a gate electrode on the layer stack laterally between the first source/drain region and the second source/drain region, and the second dielectric layer between the gate electrode and the first dielectric layer; and
a first contact extending through the layer stack to the first source/drain region,
wherein the layer stack includes a third dielectric layer between the second dielectric layer and the gate electrode, the first dielectric layer comprises a first dielectric material, the second dielectric layer comprises a second dielectric material different from the first dielectric material, and the third dielectric layer comprises a third dielectric material different from the first dielectric material and the second dielectric material.

2. The structure of claim 1 further comprising:
a second contact extending through the layer stack to the second source/drain region.

3. The structure of claim 2 wherein the gate electrode is laterally positioned on the layer stack laterally between the first contact and the second contact.

4. The structure of claim 1 wherein the first dielectric material is silicon nitride, the second dielectric material is silicon dioxide, and the third dielectric material comprises carbon-doped silicon nitride.

5. The structure of claim 1 wherein the semiconductor substrate includes a planar device region, and the first field-effect transistor is formed in the planar device region.

6. The structure of claim 1 wherein the first field-effect transistor is positioned in a first device region of the semiconductor substrate, and further comprising:
a second field-effect transistor in a second device region of the semiconductor substrate, the second field-effect transistor including a semiconductor fin on the semiconductor substrate and a gate structure extending transversely over the semiconductor fin.

7. The structure of claim 6 wherein the first dielectric layer is positioned between the gate structure and the second dielectric layer.

8. The structure of claim 6 wherein the first dielectric layer and the second dielectric layer overlap with the gate structure.

9. The structure of claim 6 wherein the second field-effect transistor includes a sidewall spacer adjacent to the gate structure, and the sidewall spacer comprises the first dielectric material.

10. The structure of claim 1 wherein the gate electrode comprises a metal, and further comprising:
a resistor on the layer stack, the resistor comprising the metal.

11. The structure of claim 1 wherein the layer stack includes a fourth dielectric layer between the first dielectric layer and the semiconductor substrate.

12. The structure of claim 11 wherein the layer stack includes a fifth dielectric layer between the fourth dielectric layer and the semiconductor substrate.

13. The structure of claim 12 wherein the fourth dielectric layer comprises the second dielectric material, and the fifth dielectric layer comprises the first dielectric material.

14. The structure of claim 13 wherein the first dielectric material is silicon nitride, the second dielectric material is silicon dioxide, and the third dielectric material comprises carbon-doped silicon nitride.

15. A structure comprising:
a semiconductor substrate;
a layer stack including a first dielectric layer and a second dielectric layer, the first dielectric layer between the second dielectric layer and the semiconductor substrate;
a first field-effect transistor including a first source/drain region in the semiconductor substrate, a second source/drain region in the semiconductor substrate, and a gate electrode on the layer stack laterally between the first source/drain region and the second source/drain region, and the second dielectric layer between the gate electrode and the first dielectric layer; and
a contact extending through the layer stack to the first source/drain region,
wherein the first dielectric layer comprises a first dielectric material, the second dielectric layer comprises a second dielectric material different from the first dielectric material, the first dielectric material is silicon dioxide, and the second dielectric material comprises carbon.

16. The structure of claim 15 wherein the second dielectric material is carbon-doped silicon nitride.

17. The structure of claim 15 wherein the layer stack includes a third dielectric layer between the second dielectric layer and the gate electrode.

18. A structure comprising:
a semiconductor substrate;
a layer stack including a first dielectric layer and a second dielectric layer, the first dielectric layer between the second dielectric layer and the semiconductor substrate;
a first field-effect transistor including a first source/drain region in the semiconductor substrate, a second source/drain region in the semiconductor substrate, and a gate electrode on the layer stack laterally between the first source/drain region and the second source/drain region, and the second dielectric layer between the gate electrode and the first dielectric layer; and
a contact extending through the layer stack to the first source/drain region,
wherein the first dielectric layer comprises a first dielectric material, the second dielectric layer comprises a second dielectric material different from the first dielectric material, and the layer stack further includes a third dielectric layer, a fourth dielectric layer, and a fifth dielectric layer between the second dielectric layer and the gate electrode.

19. The structure of claim 18 wherein the fourth dielectric layer is positioned between the third dielectric layer and the fifth dielectric layer, the third dielectric layer comprises the first dielectric material, and the fourth dielectric layer comprises the second dielectric material.

20. The structure of claim 19 wherein the first dielectric material is silicon nitride, the second dielectric material is silicon dioxide, and the fifth dielectric layer comprises carbon-doped silicon nitride.

\* \* \* \* \*